US007300596B2

(12) United States Patent
Murayama et al.

(10) Patent No.: US 7,300,596 B2
(45) Date of Patent: Nov. 27, 2007

(54) METHOD OF MANUFACTURING LIQUID DISCHARGE HEAD

(75) Inventors: Hiroyuki Murayama, Kanagawa (JP); Shuji Koyama, Kanagawa (JP); Yoshinori Tagawa, Kanagawa (JP); Kenji Fujii, Kanagawa (JP); Masaki Ohsumi, Kanagawa (JP); Yoshinobu Urayama, Kanagawa (JP); Jun Yamamuro, Kanagawa (JP); Tsuyoshi Takahashi, Kanagawa (JP); Masahisa Watanabe, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/481,796

(22) Filed: Jul. 7, 2006

(65) Prior Publication Data

US 2007/0017894 A1 Jan. 25, 2007

(30) Foreign Application Priority Data

Jul. 25, 2005 (JP) ............................ 2005-214812
Jun. 21, 2006 (JP) ............................ 2006-171254

(51) Int. Cl.
*B41J 2/05* (2006.01)
*H01L 21/00* (2006.01)

(52) U.S. Cl. ............................ 216/27; 216/41; 216/58; 216/67; 438/21; 347/54; 347/65

(58) Field of Classification Search .................. 216/27, 216/41, 58; 438/21; 347/54, 65
See application file for complete search history.

(56) References Cited

U.S. PATENT DOCUMENTS 5,478,606 A * 12/1995 Ohkuma et al. ............ 427/555
6,139,761 A 10/2000 Ohkuma
6,145,965 A 11/2000 Inada et al.
6,390,606 B1 5/2002 Terui et al.
6,638,439 B2 * 10/2003 Shimomura .................. 216/27
7,005,244 B2 2/2006 Park et al.
7,070,912 B2 7/2006 Park et al.
2005/0117005 A1 * 6/2005 Fujii et al. .................... 347/92

FOREIGN PATENT DOCUMENTS

JP 2005-104156 4/2005
JP 2005-205916 8/2005
KR 10-2005-0069456 7/2005

OTHER PUBLICATIONS

Office Action dated Jun. 21, 2007, issued in Korean patent application No. 10-2006-68933, with partial English-language translation.

* cited by examiner

*Primary Examiner*—Shamim Ahmed
(74) *Attorney, Agent, or Firm*—Fitzpatrick, Cella, Harper & Scinto

(57) ABSTRACT

The method of manufacturing a recording head has a flow path wall forming step of forming flow path walls on a substrate having energy generating elements formed thereon, an imbedded material depositing step of depositing an imbedded material between the flow path walls and on a top of each flow path wall, a flattening step of polishing a top of the deposited imbedded material, until the top of the flow path wall is exposed, and a step of forming an orifice plate on the tops of the polished imbedded material and the exposed flow path wall. In the step of forming the flow path walls, patterning of a close contact property improvement layer is simultaneously performed to improve a close contact property between the flow path wall and the substrate.

9 Claims, 6 Drawing Sheets

METHOD OF MANUFACTURING LIQUID DISCHARGE HEAD

BACKGROUND OF THE INVENTION

1. Field of the Invention

The present invention relates to a method of manufacturing a liquid discharge head, more particularly to a method of manufacturing a liquid path forming member of a liquid discharge head.

2. Related Background Art

In recent years, there have increasingly progressed miniaturization and densification of a liquid discharge head represented by an ink jet recording head. In the ink jet recording head in which an ink discharge port is disposed so as to face an energy generating element to generate energy for discharging ink, the energy generating element, an electric control circuit which drives this element and the like are formed on a substrate by use of a semiconductor manufacturing technology.

In a highly functional ink jet recording head, as a method of supplying the ink to a plurality of ink discharge ports (nozzles), there is adopted a structure in which an ink supply port is formed so as to extend through the surface and the back of the substrate, and an ink flow path is disposed so as to extend from the ink supply port to each discharge port. In a case where a silicon substrate is used as the substrate, as disclosed in U.S. Pat. No. 6,139,761, the ink supply port is often formed using a silicon anisotropic etching technology. In a case where a photosensitive resin is used as a liquid path forming member in which the ink flow paths and the discharge ports are formed, in order to increase a close contact force between the liquid path forming member and the silicon substrate, U.S. Pat. No. 6,390,606 discloses a constitution in which the liquid path forming member is bonded to the substrate via a adhesive layer made of a polyether amide resin.

On the other hand, as a method of manufacturing the liquid path forming member, as described in U.S. Pat. Nos. 6,139,761 and 6,145,965, there is known a method of disposing on the substrate a mold material which forms the flow path; coating this mold material with a resin which forms the liquid path forming member; forming the discharge port; and removing the mold material.

Moreover, in Japanese Patent Application Laid-Open No. 2005-104156, there is disclosed a manufacturing method of forming on the substrate a member which forms a side wall of the ink flow path; using positive photo resist a plurality of times; forming a sacrifice layer having a flat top in a space surrounded with the side wall of the ink flow path; and forming an orifice plate on the sacrifice layer. According to this specification, in this method, a shape and a dimension of the ink flow path are easily controlled, and a uniform ink flow path can be obtained.

However, the present inventors have manufactured the liquid discharge head by the method disclosed in Japanese Patent Application Laid-Open No. 2005-104156, and have found a case where the liquid path forming member peels from the substrate during use over a long period. It is considered that the adhesive layer is made of the polyether amide resin disclosed in U.S. Pat. No. 6,390,606 in order to improve a close contact property between the liquid path forming member and the substrate. However, since the polyether amide resin itself does not have any photosensitivity, steps become complicated. That is, in a case where the polyether amide resin is patterned, the photo resist is patterned to form a mask material, and the patterning needs to be performed by etching.

SUMMARY OF THE INVENTION

The present invention has been developed in view of the above-described problem, and an object thereof is to provide a method of manufacturing a liquid discharge head, in which it is possible to easily manufacture the liquid discharge head capable of bearing use over a long period and having an excellent reliability.

In addition to the above-described object or separately from the object, another object of the present invention is to provide a manufacturing method in which manufacturing steps can be simplified to thereby manufacture an excellent liquid discharge head at low cost.

To solve the above-described problem, a method of manufacturing a liquid discharge head in the present invention comprises a adhesive layer coating step of coating a adhesive layer made of a polyether amide resin on a substrate including an array of energy generating elements which apply, to ink, energy for discharging the ink; a flow path wall forming step of forming, on the adhesive layer, a flow path wall disposed for the energy generating elements; a adhesive layer forming step of etching the adhesive layer by use of the flow path wall as a mask to pattern the adhesive layer; an imbedded material depositing step of depositing an imbedded material on the substrate having the flow path wall formed thereon so as to cover the flow path wall; a flattening step of substantially flatly polishing a top of the deposited imbedded material, until a top of the flow path wall is exposed; an orifice plate forming step of forming an orifice plate on the tops of the polished imbedded material and the exposed flow path wall; a discharge port forming step of forming a discharge port in the orifice plate; and an eluting step of eluting the imbedded material, the imbedded material depositing step being performed after the adhesive layer forming step.

According to the method of manufacturing the liquid discharge head in the present invention, since there is disposed, between the substrate and the flow path wall, the adhesive layer made of the polyether amide resin for improving a close contact property between the substrate and the flow path wall, there is not a problem that the flow path forming member does not peel from the substrate during the use over a long period. Furthermore, as the flow path wall, resist for patterning the polyether amide resin is utilized as such, and this can reduce the steps. In consequence, it is possible to provide the method of manufacturing the liquid discharge head, in which it is possible to easily manufacture the liquid discharge head capable of bearing the use over the long period and having an excellent reliability.

In another aspect of the present invention, a method of manufacturing a liquid discharge head comprises a flow path wall forming step of forming a flow path wall disposed for energy generating elements on a substrate including an array of the energy generating elements which apply, to ink, energy for discharging the ink; an imbedded material depositing step of depositing an imbedded material on the substrate having the flow path wall formed thereon so as to cover the flow path wall; a flattening step of substantially flatly polishing a top of the deposited imbedded material, until a top of the flow path wall is exposed; an orifice plate forming step of forming an orifice plate on the tops of the polished imbedded material and the exposed flow path wall; a discharge port forming step of forming a discharge port in the orifice plate; a step of etching the substrate from a face opposite to a face provided with the discharge energy generating elements, and forming an ink supply port which communicates with the ink flow path; and an eluting step of eluting the imbedded material, a mask for forming the ink supply port being formed on the back of the substrate in a state in which the imbedded material is deposited so as to cover the flow path wall.

According to the method of manufacturing the liquid discharge head in the other aspect of the present invention, a member which protects the surface of the substrate does not have to be disposed separately, when the mask for forming the ink supply port is formed on the back of the substrate. This can simplify the steps. In consequence, it is possible to provide the manufacturing method in which the manufacturing steps can be simplified to thereby manufacture the excellent liquid discharge head at low cost.

DETAILED DESCRIPTION OF THE PREFERRED EMBODIMENTS

Next, embodiments of the present invention will be described in detail with reference to the drawings.

First Embodiment

Figure 1:
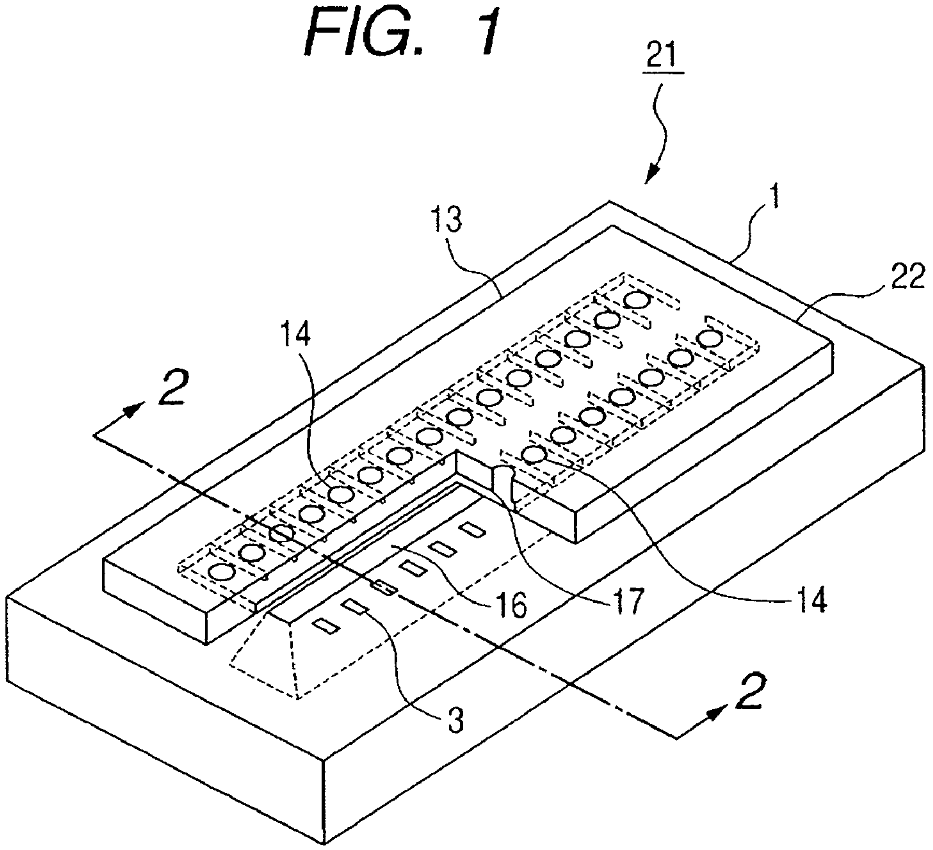
FIG. 1 is a partially broken perspective view showing a part of a liquid discharge head in the present invention.
Figure 2:
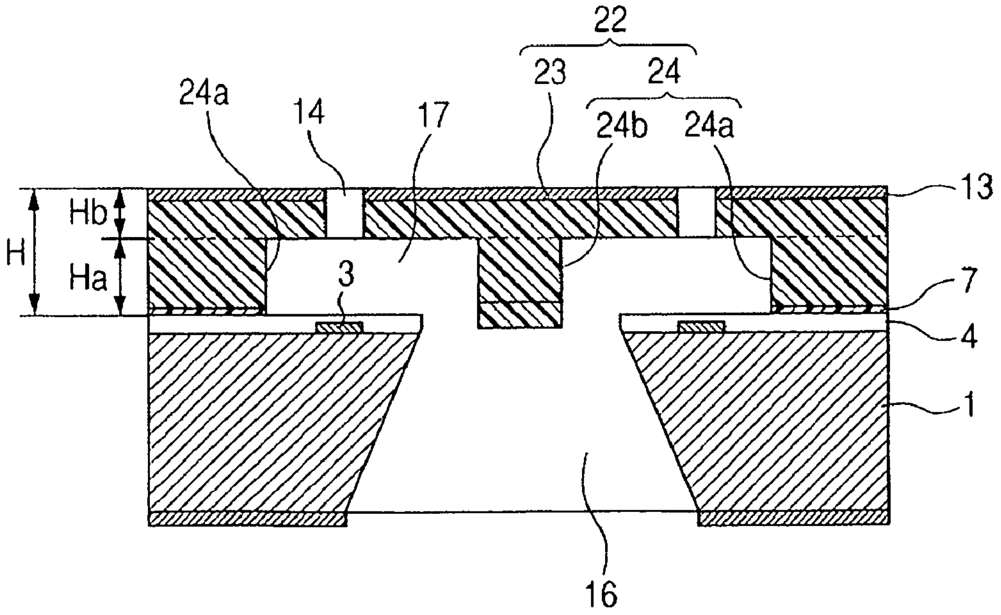
FIG. 2 is a schematic sectional view cut along the 2-2 line of FIG. 1 and showing a liquid discharge head to which a first embodiment of the present invention is applied.

A first embodiment of the present invention will be described with reference to the drawings. First, there will be described a schematic constitution of an ink jet recording head (liquid discharge head) to which the present invention is applied. FIG. 1 is a partially broken perspective view showing a part of the ink jet recording head to which the present invention is applied. FIG. 2 is a schematic sectional view of the ink jet recording head cut along the 2-2 line of FIG. 1.

The present ink jet recording head is mountable on a device such as a printer, a photocopier, a facsimile machine having a communication system or a word processor having a printer unit, or an industrial recording device combined with various types of processing devices in a composite manner. The present ink jet recording head can perform recording on various recording mediums made of paper, thread, fiber, leather, metal, plastic, glass, wood, ceramic and the like. It is to be noted that in the present specification, "recording" means not only that a meaningful image such as a character or a graphic is formed on the recording medium but also that a meaningless image such as a pattern is formed.

An ink jet recording head 21 has a substrate 1 in which there are arranged at predetermined pitches two arrays of ink discharge energy generating elements (liquid discharge energy generating elements) 3 to apply discharging energy to ink. A flow path forming member 22 is formed on the substrate 1.

The flow path forming member 22 includes an orifice plate 23 including discharge ports 14 which discharge the ink; and a flow path wall 24 disposed between the orifice plate 23 and the substrate 1. The flow path wall 24 has first flow path walls **24*a* disposed on opposite sides of the arrays of the ink discharge energy generating elements 3; and a second flow path wall 24*b* disposed between the arrays. The flow path walls 24*a*, 24*b* are formed along the arrays of the ink discharge energy generating elements 3, and define a part of an ink flow path 17 which communicates with the discharge ports 14 between the orifice plate 23 and the substrate 1. The flow path walls 24*a*, 24*b* are made of a coating photosensitive resin 9 (see FIGS. 3A to 3H). The first flow path walls 24*a* are bonded to the substrate 1 by use of a resin layer 7 made of a polyether amide resin as a adhesive layer. The resin layer 7 is formed into substantially the same flat shape as that of the first flow path wall 24*a*, and does not protrude into the ink flow path 17. The orifice plate 23 is made of a coating photosensitive resin 12 (see FIGS. 3A to 3H) which is the same type of material as that of the coating photosensitive resin 9. Each discharge port 14 is disposed substantially right above each ink discharge energy generating element 3**.

The substrate 1 is made of silicon in which a crystal face orientation is a <100> face, with the proviso that the crystal orientation is not limited to the <100> face. For example, another crystal face orientation such as a <110> face may be used. An ink supply port (liquid supply port) 16 extends through the substrate 1 from the surface of the substrate to the back thereof, and opens between two arrays of the ink discharge energy generating elements 3. The ink supply port 16 is disposed in common to two arrays of the ink discharge energy generating elements 3, and supplies the ink to each ink flow path 17. The ink flows from the ink supply port 16 into each ink flow path 17 so that the path is filled. The ink discharge energy generating elements 3 apply pressure so that the ink is discharged as ink droplets from the discharge ports 14, and attached to a recording medium to perform recording. A dimension H between the ink discharge energy generating element 3 and the discharge port 14, which is important for an ink discharge characteristic, is precisely controlled by the following method of manufacturing the ink jet recording head.

Next, the above-described one embodiment of the method of manufacturing the ink jet recording head will be described with reference to the drawing. FIGS. 3A to 3H are schematic sectional views showing the method of manufacturing the recording head in the first embodiment of the present invention. Each drawing of FIGS. 3A to 3H is a sectional view cut along the 2-2 line of FIG. 1, and shows the view from the same direction as that of FIG. 2.

Figure 3A:
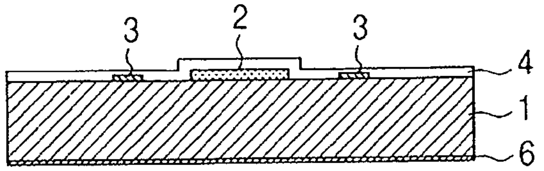
FIGS. 3A, 3B, 3C, 3D, 3E, 3F, 3G and 3H are schematic sectional views showing a method of manufacturing the liquid discharge head in the first embodiment of the present invention.

First, as shown in FIG. 3A, on the substrate 1, there are arranged a plurality of ink discharge energy generating elements 3 made of a heat generation resistive material or the like. At this time, a functional element for driving each ink discharge energy generating element is disposed using a semiconductor step, but a silicon oxide film 6 formed in the semiconductor step is formed on the whole back of the substrate 1. Next, a sacrifice layer 2 is disposed in a position of the substrate 1 where the ink supply port 16 is to be formed. The sacrifice layer 2 can preferably be etched with an alkaline solution, and is made of polysilicon, aluminum having a fast etching speed, aluminum silicon, aluminum copper, aluminum silicon copper or the like. Although not shown, a wiring line of each ink discharge energy generating element 3, or a semiconductor element for driving the heat generation resistive material is also formed on the substrate 1. The surface of the substrate 1 is covered with a protective film 4 formed of an SiN layer or a Ta layer.

Figure 3B:
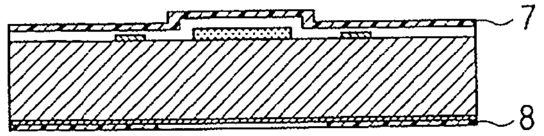

Next, as shown in FIG. 3B, the surface and the back of the substrate 1 are coated with resin layers 7, 8 made of polyether amide, and baked to thereby harden. Next, to form an opening for forming the ink supply port 16 in a resin layer 8 on the back of the substrate 1, positive resist is applied by spin coating or the like, exposed and developed, the resin layer 8 is patterned by dry etching or the like, and the positive resist is peeled. In this case, if necessary, the surface or the side of the substrate 1 may be protected with a protective material or the like.

Figure 3C:
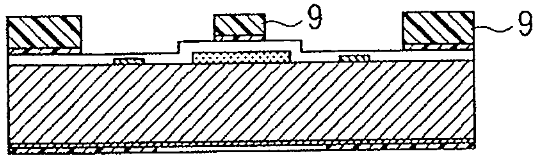

Next, as shown in FIG. 3C, the coating photosensitive resin 9 to form the flow path wall 24 is applied by a spin coating process or the like, exposed to an ultraviolet ray, a deep ultraviolet ray or the like and developed to form the flow path wall 24 (first and second flow path walls 24*a*, 24*b*). Next, the exposed resin layer 7 is removed by dry etching or the like using oxygen plasma, and the resin layer 7 is molded into substantially the same shape as that of the flow path wall 24 (first flow path wall 24*a*). To improve a mechanical strength of the flow path wall 24, the coating photosensitive resin 9 preferably contains a photo cationic polymerization initiator.

Figure 3D:
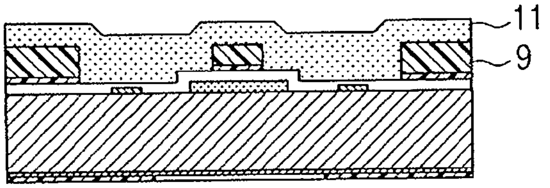

Next, as shown in FIG. 3D, an imbedded material 11 (as one example, ODUR1010: manufactured by Tokyo Ohka Kogyo Co., Ltd.) is deposited between the flow path walls 24 (between the first flow path wall 24*a* and the second flow path wall 24*b*) and on the top of the flow path wall 24 (on the tops of the first and second flow path walls 24*a*, 24*b*), and the material is baked. Examples of a depositing method include a method of applying the imbedded material 11 between the flow path walls and on the flow path wall by the spin coating or the like. When the imbedded material 11 is deposited, it is possible to prevent falling of the flow path wall or the like during chemical mechanical polishing (CMP). A positive material is usable in the imbedded material 11, and preferably contains an acrylic resin.

Figure 3E:
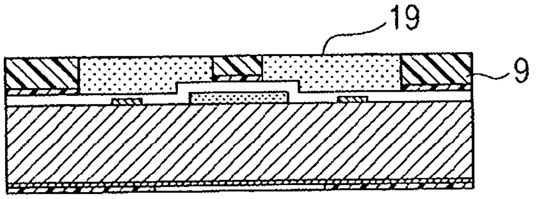

Next, as shown in FIG. 3E, the top of the deposited imbedded material 11 is polished by the chemical mechanical polishing until the top of the flow path wall is exposed, and the top is flattened and cleaned. To prevent or reduce generation of scratches (micro flaws) or dishing (unevenness) on the polished face during the chemical mechanical polishing, it is preferable to optimize polishing conditions such as pressure, rotation number and polishing abrasive grains (alumina, silica, etc.)

Figure 3F:
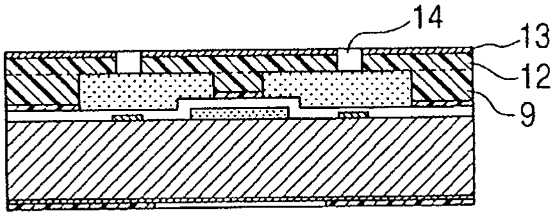

Next, as shown in FIG. 3F, the tops of the polished imbedded material 11 and the exposed flow path wall 24 are coated with the coating photosensitive resin 12 which is the same type of material as that of the flow path wall 24 by the spin coating process or the like, and the orifice plate 23 is formed. It is preferable that the coating photosensitive resin 12 contains the photo cationic polymerization initiator in order to improve the mechanical strength of the orifice plate 23. Next, a water repellent material 13 is formed on the coating photosensitive resin 12 by a method such as the spin coating process or a method of laminating dry films. Next, the material is exposed to the ultraviolet ray, the deep ultraviolet ray or the like, developed and patterned to form the discharge ports 14. When the discharge ports are formed, there may be used dry etching by irradiation with oxygen plasma or excimer laser.

Figure 3G:
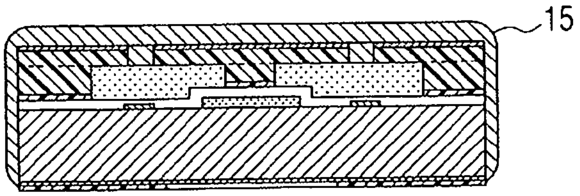

Next, as shown in FIG. 3G, a protective material 15 is applied to the surface and the side of the substrate 1 patterned and provided with the imbedded material 11, the coating photosensitive resin 12 and the like by the spin coating or the like to coat the substrate. Purposes of the protective material 15 are prevention of scratches during conveyance, prevention of deterioration of the water repellent material 13 or the like at a time when anisotropic etching is performed in the next step and the like. Therefore, it is preferable that the protective material 15 is formed of a material capable of sufficiently bearing a strong alkaline solution for use in the anisotropic etching. Next, the silicon oxide film 6 on the back of the substrate 1 is wet-etched, and the silicon surface of the substrate 1 is exposed excluding a portion masked by the resin layer 8.

Figure 3H:
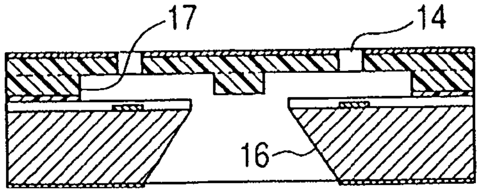

Next, as shown in FIG. 3H, the substrate 1 is subjected to the anisotropic etching (chemical etching) by a strong alkaline solution such as TMAH. Since the crystal orientation of the substrate 1 is <100> or <110>, the anisotropic etching which proceeds from the back of the substrate 1 easily reaches the sacrifice layer 2 on the surface of the substrate 1, the sacrifice layer 2 is dissolved, and the ink supply port 16 is formed. Next, the resin layer 8 and the protective material 15 are removed, and further the imbedded material 11 is eluted from the ink supply port 16 formed as described above. To remove the imbedded material 11, after exposing the front of the substrate to the deep ultraviolet ray, developing and drying may be performed. If necessary, during the developing, the substrate may be submerged into ultrasonic waves. In consequence, the flow path forming member 22 is formed on the substrate 1.

Thereafter, the substrate 1 having the flow path forming member 22 formed thereon is cut and separated into chips by a dicing saw or the like, and electric bonding is performed in order to drive the ink discharge energy generating elements 3. Furthermore, a chip tank member is connected in order to supply the ink, thereby completing the ink jet recording head.

According to the above embodiment, there is improved precision of the dimension H (see FIG. 2) between the ink discharge energy generating element 3 and the discharge port 14. A reason for this will be described hereinafter. The dimension H is determined by a height Ha of the first flow path wall 24*a* and a thickness Hb of the orifice plate 23 (including the water repellent material 13). First, preparation precision of the height Ha of the first flow path wall 24*a* is improved by independently forming the flow path wall 24 (FIG. 3C). In FIG. 3E, the chemical mechanical polishing ends, when the top of the first flow path wall 24*a* is exposed. This prevents the first flow path wall 24*a* formed in FIG. 3C from being unnecessarily polished, and the preparation precision is not deteriorated.

Next, the preparation precision of the thickness Hb of the orifice plate 23 is improved as follows. The preparation precision of the thickness Hb of the orifice plate 23 is dominated by the whole flatness of the orifice plate 23 and smoothness of the orifice plate 23 itself. In the embodiment of the present invention, since the top of the imbedded material 11 is flattened in accordance with the height of the first flow path wall 24*a*, these polished faces are entirely formed in parallel with the faces of the substrate 1 without any unevenness after the polishing. Since the coating photosensitive resin 12 to form the orifice plate 23 is applied to such flat face, the coating photosensitive resin 12 is also formed to be flat, and the whole flatness of the orifice plate 23 is secured. Moreover, local unevenness of the imbedded material 11 itself is eliminated by the polishing, and the flatness of the top of the imbedded material 11 is improved. Since the coating photosensitive resin 12 is applied to the top of the imbedded material 11 having its flatness enhanced in this manner, the local unevenness of the orifice plate 23 is not easily generated, and the smoothness of the orifice plate 23 itself is also improved. Furthermore, since the periphery of the imbedded material 11 is protected by the first flow path wall 24*a*, the imbedded material 11 collapses during the application of the coating photosensitive resin 12, and there is little possibility that the flatness is impaired. For the above reason, the preparation precision of the thickness Hb of the orifice plate 23 is enhanced.

As described above, in the present invention, since the flow path wall and the orifice plate are individually formed, and the orifice plate forming face is flattened beforehand, it is possible to individually control finishing precisions of the height of the flow path wall and the thickness of the orifice plate, and it is possible to enhance the preparation precision of the dimension H between the ink discharge energy generating element 3 and the discharge port 14.

Second Embodiment

Next, a second embodiment of the present invention will be described with reference to FIGS. 4A to 4E. The present embodiment is different from the first embodiment in a pattern shape of a adhesive layer. FIGS. 4A to 4E are schematic sectional views showing a main part of a process of manufacturing a recording head in the second embodiment of the present invention. Each drawing of FIGS. 4A to 4E are sectional views cut along the 2-2 line of FIG. 1, and is shown from the same direction as that of FIG. 2 or FIGS. 3A to 3H.

There will be described hereinafter a different respect of the present embodiment from the above first embodiment.

Figure 4A:
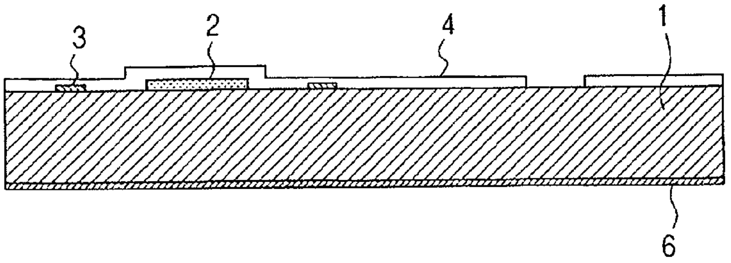
FIGS. 4A, 4B, 4C, 4D and 4E are schematic sectional views showing a main part of a method of manufacturing a liquid discharge head in a second embodiment of the present invention.
Figure 4B:
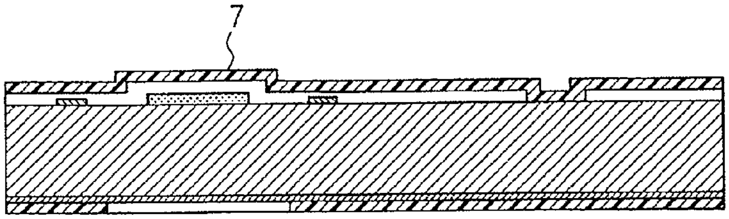
Figure 4C:
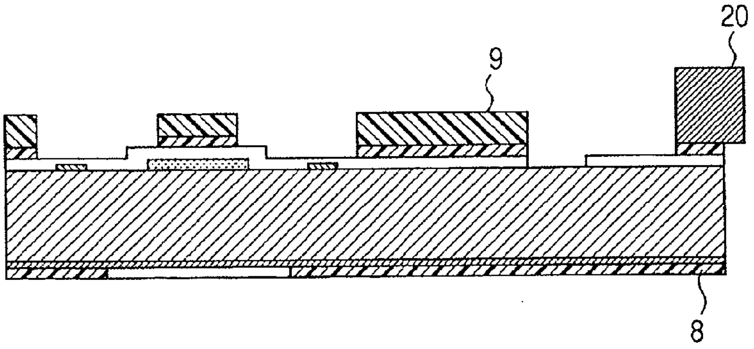
Figure 4D:
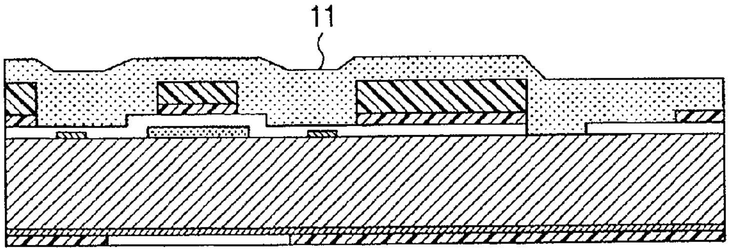
Figure 4E:
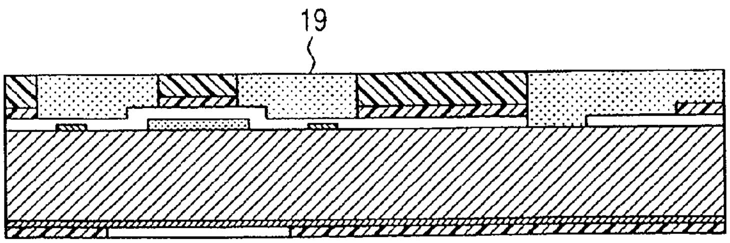
Figure 5:
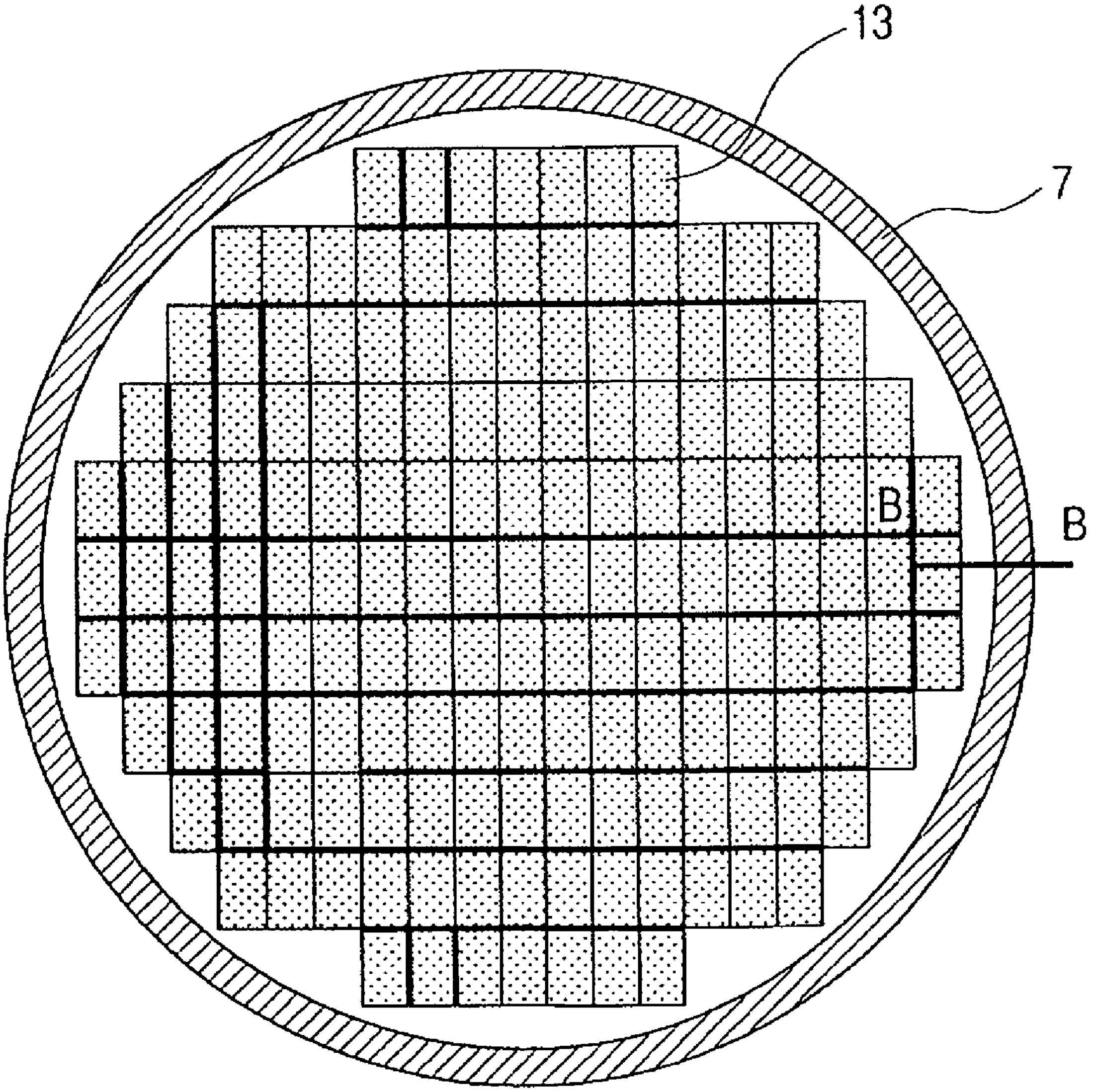
FIG. 5 is an explanatory view showing a state of the surface of a silicon substrate in the second embodiment of the present invention.

First, as shown in FIG. 4A, there is prepared a substrate 1 including ink discharge energy generating elements 3, a sacrifice layer 2, a protective film 4 and an $SiO_2$ film 6. Next, as shown in FIG. 4B, a polyether amide resin layer 7 is applied to the surface of the substrate 1, and a polyether amide resin layer 8 is applied to the back of the substrate by spin coating or the like, and the substrate is baked to thereby harden. Subsequently, to form an ink supply port 16 in the polyether amide resin layer 8 on the back of the substrate, positive resist is applied by the spin coating or the like, exposed and developed, the layer is patterned by dry etching or the like, and the positive resist is peeled. Next, as shown in FIG. 4C, a coating photosensitive resin 9 to form a side wall of a flow path is applied by the spin coating or the like, exposed to an ultraviolet ray, a deep UV ray or the like and developed to form the flow path side wall. Next, the polyether amide resin 7 is etched by dry etching or the like by use of the flow path side wall as a mask, and the adhesive layer is formed into the same shape as that of the flow path side wall. Here, in the present embodiment, as shown in FIG. 5, etching is performed so that the polyether amide resin 7 of the adhesive layer is left in an outer peripheral portion of a silicon substrate. Specifically, a wafer outer peripheral portion is mechanically masked with a chuck 20 or the like, and the substrate is worked with an etching device having a mechanism which protects the wafer outer peripheral portion from an etching gas.

Thereafter, in the same manner as in the above first embodiment, an imbedded material is applied (FIG. 4D), and flattened by CMP or the like (FIG. 4E), and an orifice plate is laminated. Thereafter, a discharge port and an ink supply port are formed. Thereafter, the substrate 1 having a nozzle portion formed therein is cut and separated into chips by a dicing saw or the like, and electric bonding is performed in order to drive the ink discharge energy generating elements 3. Thereafter, a chip tank member is connected in order to supply ink, thereby completing an ink jet recording head.

According to the manufacturing method of the present embodiment, the imbedded material is laminated and polished in a state in which the polyether amide resin layer remains in the outer peripheral portion of the wafer shown in FIG. 5. Therefore, peeling of an outer peripheral imbedded material can be inhibited during the polishing, and stability of production can further be improved.

It is to be noted that a method of forming the pattern of the adhesive layer of the outer peripheral portion is not limited to the above method. For example, after once etching and removing the adhesive layer of the outer peripheral portion, a polyether amide resin may be applied again to the outer peripheral portion by use of an outer-periphery coating device to thereby form the pattern.

Third Embodiment

Next, a third embodiment of the present invention will be described with reference to FIGS. 6A to 6I. The present embodiment is different from the first embodiment in a step of forming a mask of an ink supply port. FIGS. 6A to 6I are schematic sectional views showing a main part of a process of manufacturing a recording head in the third embodiment of the present invention. Each drawing of FIGS. 6A to 6I are sectional views cut along the 2-2 line of FIG. 1, and is shown from the same direction as that of FIG. 2 or FIGS. 3A to 3H.

There will be described hereinafter a different respect of the present embodiment from the above first embodiment.

Figure 6A:
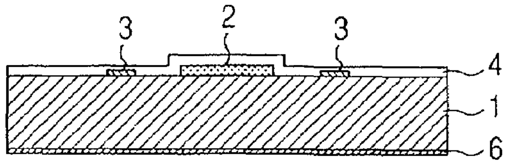
FIGS. 6A, 6B, 6C, 6D, 6E, 6F, 6G, 6H and 6I are schematic sectional views showing a method of manufacturing a liquid discharge head in a third embodiment of the present invention.
Figure 6B:
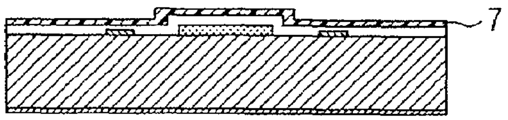
Figure 6C:
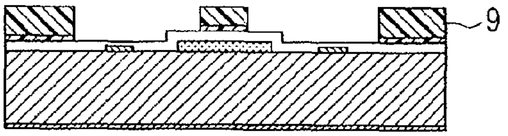
Figure 6D:
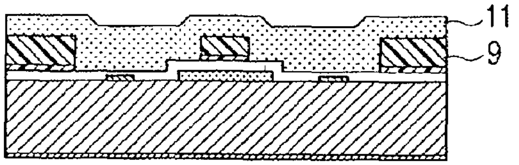
Figure 6E:
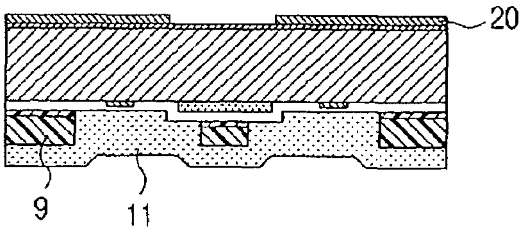
Figure 6F:
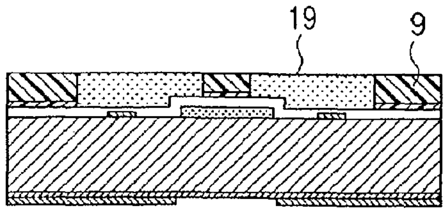

First, as shown in FIG. 6A, there is prepared a substrate 1 including ink discharge energy generating elements 3, a sacrifice layer 2, a protective film 4 and an $SiO_2$ film 6. Next, as shown in FIG. 6B, a polyether amide resin layer 7 is applied to the surface of the substrate 1 by spin coating or the like, and the substrate is baked to thereby harden. Next, as shown in FIG. 6C, a coating photosensitive resin 9 to form a side wall of a flow path is applied by the spin coating or the like, exposed to an ultraviolet ray, a deep UV ray or the like and developed to form the flow path side wall. Next, the polyether amide resin 7 is etched by dry etching or the like by use of the flow path side wall as a mask, and a adhesive layer is formed into the same shape as that of the flow path side wall. Next, as shown in FIG. 6D, an imbedded material 11 is applied to the flow path side wall by the spin coating, and baked. At this time, the imbedded material is a material for prevention of falling of the flow path side wall during chemical mechanical polishing (CMP), and a positive material or the like may be imbedded. Next, as shown in FIG. 6E, the imbedded material is used as a surface protective film, the back of the substrate is coated with a photosensitive resin 20, exposed and developed, and the back is formed as a mask for working the oxide film 6 to form the ink supply port.

Figure 6G:
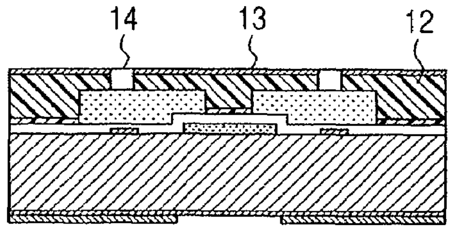
Figure 6H:
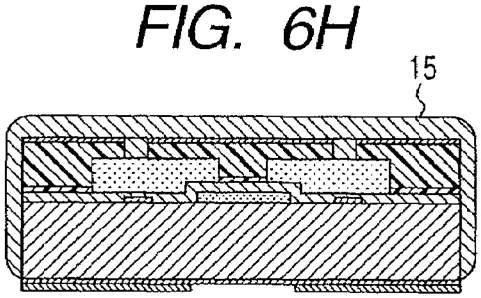
Figure 6I:
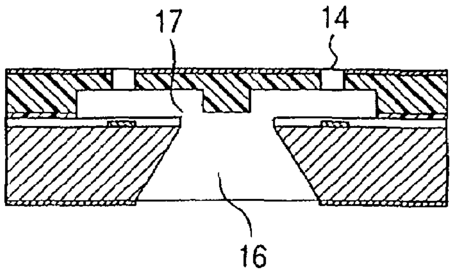

Thereafter, in the same manner as in the first embodiment, the substrate is flattened by CMP or the like (FIG. 6F), an orifice plate is laminated, and a discharge port is formed (FIG. 6G). Thereafter, the substrate is protected with a protective material (FIG. 6H), and the ink supply port is formed (FIG. 6I). Next, the photosensitive resin 20 is removed, and the imbedded material 11 is eluted from the ink supply port. Thereafter, the substrate 1 having a nozzle portion formed therein is cut and separated into chips by a dicing saw or the like, and electric bonding is performed in order to drive the ink discharge energy generating elements 3. Thereafter, a chip tank member is connected in order to supply the ink, thereby completing the ink jet recording head.

In the present embodiment, when the surface of the substrate is covered with the imbedded material, the back of the substrate is worked. Accordingly, the surface substitutes for the protective material. Moreover, since the back of the substrate is worked with the photosensitive resin, a back working step is simplified. Therefore, an ink jetting substrate can be manufactured at low cost.

Figure 7:
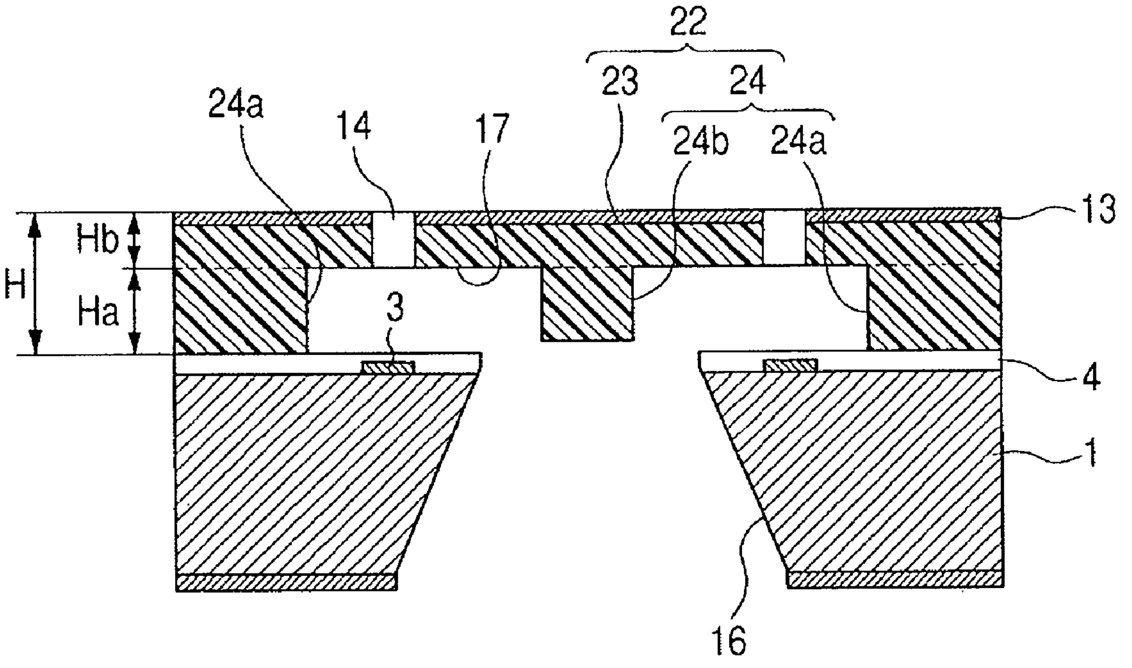
FIG. 7 is a schematic sectional view of the liquid discharge head to which the third embodiment of the present invention can be applied.

Furthermore, it has been described in the present embodiment that the adhesive layer is disposed, but the present invention is applicable even to an ink jet recording head which does not have any adhesive layer as shown in FIG. 7.

This application claims priorities from Japanese Patent Application Nos. 2005-214812 filed on Jul. 25, 2005, and 2006-171254 filed on Jun. 21, 2006, which are hereby incorporated by reference herein.

What is claimed is:

1. A method of manufacturing a liquid discharge head, comprising:

an adhesive layer coating step of coating an adhesive layer made of a polyether amide resin on a substrate including an array of energy generating elements which apply, to ink, energy for discharging the ink;

a flow path wall forming step of forming, on the adhesive layer, a flow path wall disposed for the energy generating elements;

an adhesive layer forming step of etching the adhesive layer by use of the flow path wall as a mask to pattern the adhesive layer;

an imbedded material depositing step of depositing an imbedded material on the substrate having the flow path wall formed thereon so as to cover the flow path wall;

a flattening step of substantially flatly polishing a top of the deposited imbedded material, until a top of the flow path wall is exposed;

an orifice plate forming step of forming an orifice plate on the tops of the polished imbedded material and the exposed flow path wall;

a discharge port forming step of forming a discharge port in the orifice plate; and an eluting step of eluting the imbedded material, wherein the imbedded material depositing step is performed after the adhesive layer forming step.

2. The method of manufacturing the liquid discharge head according to claim 1, further comprising:

a step of hardening the flow path wall after the flow path wall forming step and before the imbedded material depositing step.

3. The method of manufacturing the liquid discharge head according to claim 1, wherein the adhesive layer is patterned by dry etching in the adhesive layer forming step.

4. The method of manufacturing the liquid discharge head according to claim 1, wherein the flow path wall and the orifice plate are made of the same resin.

5. The method of manufacturing the liquid discharge head according to claim 4, wherein the flow path wall and the orifice plate are made of a negative photosensitive resin, and the imbedded material is made of a positive photosensitive resin.

6. The method of manufacturing the liquid discharge head according to claim 1, further comprising, before the eluting step, a step of etching the substrate from a face opposite to a face provided with the discharge energy generating elements, and forming an ink supply port which communicates with the ink flow path, the eluting step including a step of eluting the imbedded material from the formed ink supply port.

7. The method of manufacturing the liquid discharge head according to claim 6, wherein the mask for forming the ink supply port is formed on the back of the substrate in a state in which the imbedded material is deposited so as to cover the flow path wall.

8. The method of manufacturing the liquid discharge head according to claim 1, wherein a polyether amide resin of an outer peripheral portion of the substrate is left by patterning of the adhesive layer.

9. A method of manufacturing a liquid discharge head comprising:

a flow path wall forming step of forming a flow path wall disposed for energy generating elements on a substrate including an array of the energy generating elements which apply, to ink, energy for discharging the ink;

an imbedded material depositing step of depositing an imbedded material on the substrate having the flow path wall formed thereon so as to cover the flow path wall;

a flattening step of substantially flatly polishing a top of the deposited imbedded material, until a top of the flow path wall is exposed;

an orifice plate forming step of forming an orifice plate on the tops of the polished imbedded material and the exposed flow path wall;

a discharge port forming step of forming a discharge port in the orifice plate;

a step of etching the substrate from a face opposite to a face provided with the discharge energy generating elements, and forming an ink supply port which communicates with the ink flow path; and an eluting step of eluting the imbedded material, wherein a mask for forming the ink supply port is formed on the back of the substrate in a state in which the imbedded material is deposited so as to cover the flow path wall.

* * * * *